United States Patent [19]

Ebihara et al.

[11] Patent Number: 4,864,402
[45] Date of Patent: Sep. 5, 1989

[54] VIDEO MEMORY

[75] Inventors: Norio Ebihara; Takayuki Sasaki; Hiroyuki Kita; Yoshihito Ohsawa, all of Kanagawa, Japan

[73] Assignee: Sony Corporation, Tokyo, Japan

[21] Appl. No.: 64,013

[22] Filed: Jun. 19, 1987

[30] Foreign Application Priority Data

Jun. 20, 1986 [JP] Japan .............................. 61-144075
Jun. 26, 1986 [JP] Japan .............................. 61-150493

[51] Int. Cl.⁴ .............................................. H04N 5/14
[52] U.S. Cl. ................................. 358/160; 358/21 R; 358/31; 358/36; 358/167; 358/337
[58] Field of Search ............... 358/21 R, 31, 36, 39, 358/40, 143, 149, 160, 167, 320, 329, 337, 340

[56] References Cited

U.S. PATENT DOCUMENTS

| | | | |
|---|---|---|---|
| 4,240,106 | 12/1980 | Michael et al. | 358/167 |
| 4,646,151 | 2/1987 | Welles, II et al. | 358/149 |
| 4,677,470 | 6/1987 | Cooper et al. | 358/160 |
| 4,746,980 | 5/1988 | Petersen | 358/160 |

FOREIGN PATENT DOCUMENTS 0177786 9/1985 Japan ...................... 358/31

Primary Examiner—James J. Groody
Assistant Examiner—Michael D. Parker
Attorney, Agent, or Firm—Hill, Van Santen, Steadman & Simpson

[57] ABSTRACT

A video memory, for use with a video tape recorder, a television receiver of the like to process a picture, is simplified and can achieve the functions of a time base corrector, a noise reducer and a comb filter, so as to considerably improve the quality of a video picture. A frequency converting circuit for use with the video memory includes a comparator for comparing first and second address signals and an address correction circuit connected to receive an output signal from the comparator. When a crossing occurs between the first and second address signals, the sequential order in which an address signal is supplied to the memory is switched by the address correcting circuit, to thereby derive a continuous output signal from the memory.

16 Claims, 7 Drawing Sheets

VIDEO MEMORY

BACKGROUND OF THE INVENTION

1. Field of the Invention

This invention relates to a video memory for use with a video tape recorder, a television receiver or the like to process a video signal.

2. Description of the Prior Art

A video memory for processing a video signal as previously proposed is shown in FIG. 1.

Referring to FIG. 1, a video signal is applied to an input terminal 1 and this video signal is then supplied to a multiplier 2 in which it is multiplied by a coefficient K (K<1). The output signal from the multiplier 2 is supplied through an adder 3 to a frame delay circuit 4 in which it is delayed by a delay time of one frame period. The output signal from the frame delay circuit 4 is supplied to a multiplier 5 in which it is multiplied by a coefficient 1−K. The output signal from the multiplier 5 is supplied to the adder 3 in which it is added with the output signal from the multiplier 2. The output signal from the frame delay circuit 4 is supplied through a first-in-first-out memory (hereinafter simply referred to as FIFO) circuit 6 to an output terminal 7.

The multiplier 2, the adder 3, the frame delay circuit 4 and the multiplier 5 constitute a kind of low pass filter having a time constant K and which constitutes a noise reducer circuit for reducing a noise component contained in the video signal. The frame delay circuit 4 may be formed of a generally available dynamic random access memory (hereinafter simply referred to as a DRAM). Since the frame delay circuit 4 operates at low speed, a serial-parallel converter and a parallel-serial converter are connected to the input and output sides of this frame delay circuit 4 though not shown.

The FIFO circuit 6 is used as a time base corrector. According to this FIFO circuit 6, the data supplied thereto is written in its memory by a write clock synchronized with an incoming video signal and in which the written data is read out from the memory by a reference read clock asynchronous to the write clock and which is developed externally. Also, since this FIFO circuit 6 operates at low speed, a serial-parallel converter and a parallel-serial converter are connected to the input and output sides thereof though not shown.

When the known video memory is constructed as shown in FIG. 1, a plurality of memories are used to reduce the noise component and to correct the time base error thereby to improve the quality of a picture. In other words, since the frame memory is used to reduce the noise component and the FIFO memory is used to correct the time base error, the known video memory is complicated in circuit arrangement. Further, these memories require control circuits for their operation. This makes the peripheral circuit complicated, the system large in size and causes several defects from a cost standpoint and from a design standpoint.

A frequency converter circuit is used in the above mentioned video memory apparatus. This frequency converter is suitable for a video memory apparatus. The known frequency converter circuit (frame synchronizer) for converting a frequency is constructed, as for example, shown in FIG. 2.

Referring to FIG. 2, there are shown a plurality of frame memories (or field memories) 1a and 2a. These frame memories 1 and 2a are supplied with data of the upper 4 bits and data of the lower 4 bits of a composite color video signal of 8 bits. That is, the frame memories 1a and 2a are each adapted to write data of 4 bits supplied thereto in turn in response to a write clock signal CKW and to read the same in response to a read clock signal CKR. At that time, the write clock signal CKW and the read clock signal CKR are not synchronized with each other so that the frame memories 1a and 2a generate output signals of frequencies different from those of the input signals, or output signals which are frequency-converted.

When "crossing" occurs between a write address signal and a read address signal used in the frame memories 1a and 2a as will be described later, this crossing is detected by a crossing detecting circuit 3a. Then, on the basis of the detected results from the crossing detecting circuit 3a, a chroma inverter 4a, to which the data read out from the memories 1a and 2a are supplied, shifts the phase of a subcarrier by 180° and supplies a video signal with correct color reproduction to an output terminal 5A.

The frame memories 1a and 2a may be each constructed, for example as shown in FIG. 3. As shown in FIG. 3, a video signal applied to an input terminal 10 is sequentially written in a serial access memory (hereinafter referred to as SAM) 11 of a line unit in response to the write clock CKW. The data written in the SAM 11 is transferred to a DRAM (dynamic random access memory) 12 and written in the DRAM 12 at its predetermined position designated by an address signal from a write address circuit 13 formed of a counter and which is supplied with a clock signal CLK.

The data written in the predetermined position of the DRAM 12 is designated by an address signal from a read address circuit 14, which is formed of a counter and supplied with the clock signal CLK, read out therefrom and transferred to and written in a SAM 16. The data transferred to the SAM 16 is shifted bit by bit each time the read clock signal CKR is supplied to the SAM 16 and then supplied to an output terminal 17. The SAMs 11 and 16 are of the same storage capacity and the clock signals CKW and CKR are not synchronized with each other.

With the circuit arrangement shown in FIG. 2, since the input and the output of each of the frame memories 1a and 2a are not synchronized with each other, the write address signal from the address circuit 13 and the read address signal from the address circuit 14 cross each other at times. When they cross each other, data is exchanged from the present field to the immediately-preceding field. This will be explained more fully with reference to FIG. 4. In FIG. 4, a solid line assumes a transition of the write address signal with respect to time and a dashed line assumes a transition of the read address signal with respect to time. Also, let it be assumed that the read address signal is higher than the write address signal in frequency (with a shorter cycle). Then, if the write address signal and the read address signal do not cross, the field information of an n-th field would be read out from $t_1$ to $t_2$; the field information of an (n+1)-th field would be read out from the time $t_2$ to $t_4$; the field information of an (n+2)-th field would be read out from $t_4$ to $t_5$; and the field information of an (n+3)-th field would be read out from time $t_5$ to $t_6$. However, when the read address signal crosses the write address signal at time $t_3$, the field information of the (n+1)-th field, namely, the field information at the present field is read out from time $t_2$ to $t_3$ but the field information of the n-th field, or field information before the preceding field information is read out from time point t3 to t4 as shown in FIG. 4. Similarly, the field information of one field before such as the field information of the (n+1)-th field is read out from the time t4 to t5 and the field information of the (n+2)-th field is read out from time t5 to t6 and so on.

In the circuit arrangement in which the frame memory 1a for the higher 4 bits and the frame memory 2a for the lower 4 bits are used as shown in FIG. 2, the above mentioned crossing does not cause any trouble, if it occurs both in the frame memories 1a and 2a simultaneously. However, it causes a serious trouble if the crossing does not occur at the same time between the frame memories 1and 2a due to the scattering of delay in the memories 1a and 2a. That is, at that time the field information and the field information of one field before are mixed between the upper 4 bits and the lower 4 bits. As a result, this exerts a fatal bad influence upon the picture.

OBJECTS AND SUMMARY OF THE INVENTION

Accordingly, it is a general object of this invention to provide an improved video memory apparatus.

It is an object of this invention to provide a video memory apparatus which can achieve the functions of a time base corrector, a noise reducer and a comb filter positively by a single memory structure without making the peripheral circuit complicated.

It is another object of this invention to provide a video memory apparatus of a simplified circuit arrangement which can improve the quality of a picture.

It is still another object of this invention to provide an improved frequency converting circuit which can overcome the shortcomings of the prior art.

It is a further object of this invention to provide a frequency converting circuit which can prevent a crossing from occurring between write and read address signals.

It is still further object of this invention to provide a frequency converting circuit which can avoid the need for a crossing detection circuit, a chroma inverter or the like.

It is yet a further object of this invention to provide a frequency converting circuit which can simplify its circuit arrangement.

According to one aspect of the present invention, there is provided a video memory apparatus comprising:

(a) input buffer means which is supplied with an input signal;

(b) memory means which is supplied with an output of said input buffer means; and (c) first and second output buffer means which are alternately supplied with an output of said memory means, wherein said input buffer means and at least either said first or second output buffer means are operated in an asynchronous relation with each other.

According to another aspect of the present invention, there is provided a frequency converting circuit in which an input signal is written in a memory at a predetermined address in response to a first address signal and data written at the predetermined address of said memory is read out therefrom in response to a second address signal and generated as a frequency-converted output signal, comprising:

(a) comparing means for comparing said first and second address signals with each other; and (b) an address correcting circuit which is supplied with an output of said comparing means, wherein when a crossing occurs between said first and second address signals, the sequential order in which the address signals are supplied to said memory is switched to thereby derive a continuous output signal from said memory.

These and other objects, features and advantages of the present invention will become apparent from the following detailed description of the preferred embodiments that are to be read in conjunction with the accompanying drawings, in which like reference numerals designate like elements and parts.

BRIEF DESCRIPTION OF THE DRAWINGS

FIGS. 10A to 10C and FIGS. 11A to 11C are respectively diagrams used to explain the operation of the embodiment shown in FIG. 8.

DESCRIPTION OF THE PREFERRED EMBODIMENTS

Figure 1:
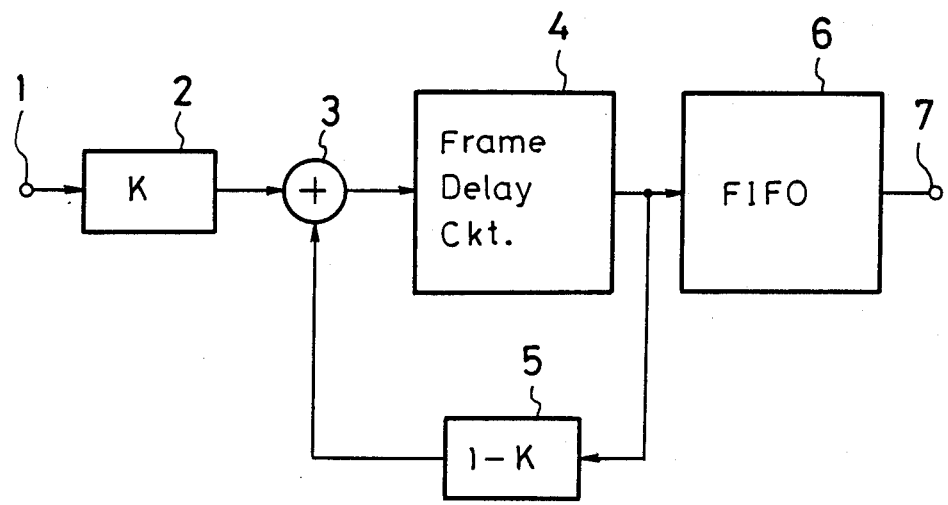
FIG. 1 is a block diagram schematically showing a prior art video memory apparatus.
Figure 2:
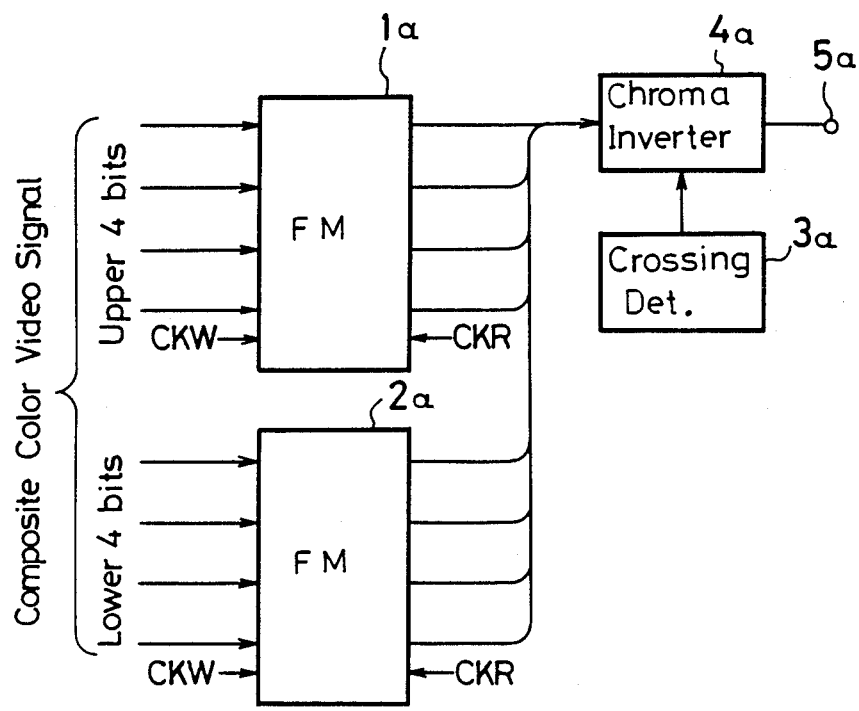
FIG. 2 is a block diagram schematically showing a known frequency converting circuit.

Now, an embodiment of the video memory apparatus according to the present invention will hereinafter be described in detail with reference to FIGS. 5 to 7.

A frame memory (or field memory) used in the video memory apparatus of this invention will be described first with reference to FIG. 5 which shows a main portion of this frame memory. Referring to FIG. 5, a video signal is supplied to an input terminal 10 as serial data. The serial data applied to the input terminal 10 is supplied to and sequentially written in a SAM 11 unit which functions as an input buffer means in response to a write clock signal CKW. Data written in the SAM 11 is transferred to a DRAM 12 in parallel over a data bus, and then written in the DRAM 12 at a predetermined address designated by an address signal from a write address circuit 13.

Data written in the DRAM 12 at a predetermined address is read out therefrom in parallel by the address signal from a first read address circuit 14, transferred to and written in a SAM 16 used as a first output buffer means. Information transferred to the SAM 16 is shifted by one bit each time the SAM 16 is supplied with a read clock signal CKR$_1$ and then supplied to an output terminal 17 as a first output OUT1.

Data written into the DRAM 12 at another predetermined address is read out therefrom in parallel by an address signal from a second read address circuit 14A, transferred to and written in a SAM 18 used as a second output buffer means. Information transferred to the SAM 18 is shifted by one bit each time the SAM 18 is supplied with a read clock signal CKR$_2$ and then supplied to an output terminal 19 as a second output OUT2. The SAMs 11, 16 and 18 are selected to have the same storage capacity.

Figure 5:
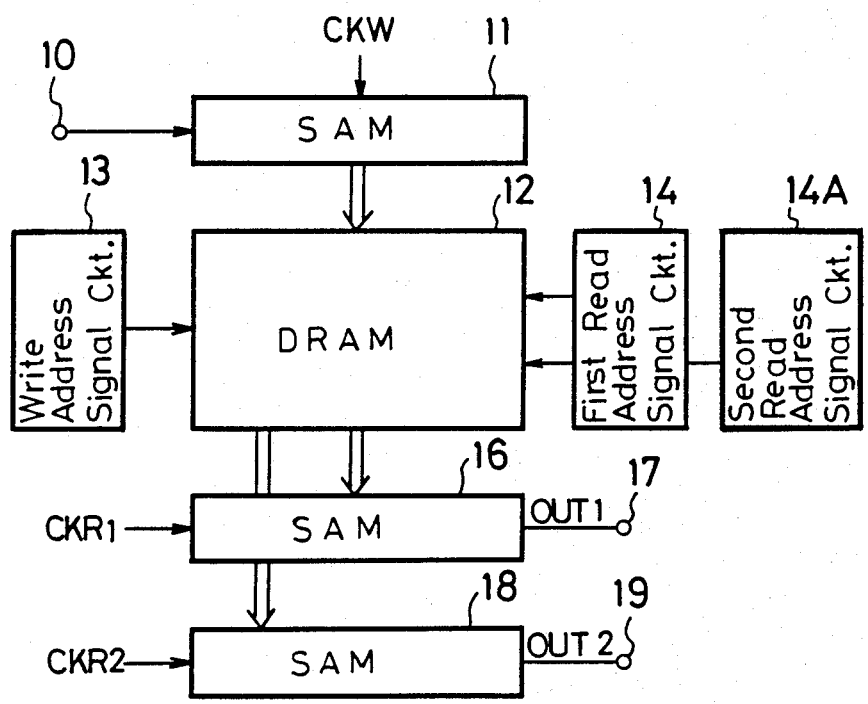
FIG. 5 is a block diagram schematically showing a main portion of a frame memory which is used in the present invention.
Figure 6:
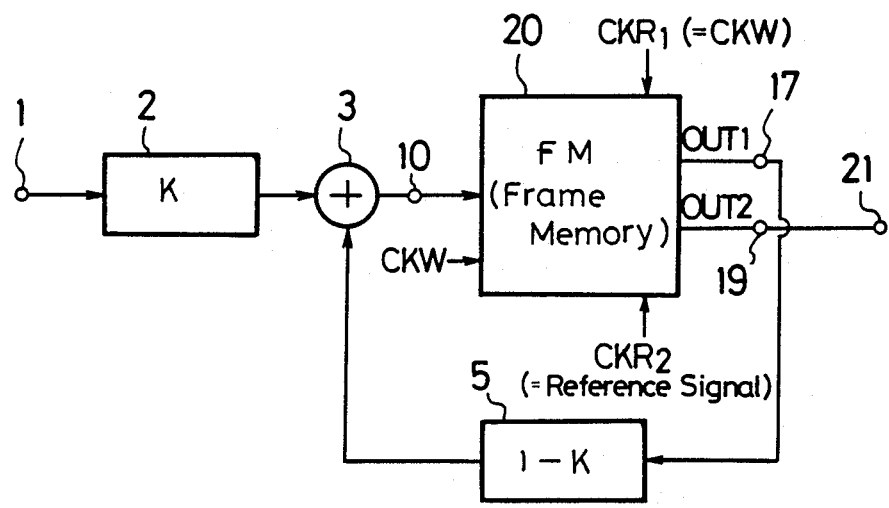
FIG. 6 is a block diagram schematically showing an embodiment of a video memory apparatus according to the present invention.

FIG. 6 schematically illustrates an embodiment of a video memory apparatus according to the present invention which employs the frame memory as shown in FIG. 5. This embodiment can achieve the function of a time base corrector and the function of a noise reducer by using the same frame memory. In FIG. 6, like parts corresponding to those of FIG. 1 are marked with the same references and will not be described in detail.

Referring to FIG. 6, there is shown a frame memory 20 constructed as shown in FIG. 5. Referring to FIGS. 5 and 6, the input terminal 10 of the frame memory 20 is connected to the output side of the adder 3 and the output terminal 17 thereof is connected to the input side of the multiplier 5. The output terminal 19 of the frame memory 20 is connected to an output terminal 21. Then, the read clock signal CKR$_1$ applied to the SAM 16 within the frame memory 20 is synchronized with the write clock signal CKW applied to the SAM 11. The read clock signal CKR$_2$ applied to the SAM 18 is made asynchronous to the read clock signal CKR$_1$ and to the write clock signal CKW, and constitutes a reference signal which is developed externally. Since the read clock signal CKR$_1$ and the write clock signal CKW are asynchronous to the read clock signal CKR$_2$, it is necessary to prevent transfer pulses from respective ports from being transferred simultaneously during a period of one horizontal line (corresponding to the duration of 1H where H is one horizontal scanning period).

The data applied to the input terminal 10 is written in the SAM 11 in response to the clock signal CKW and then transferred through the DRAM 12 to the SAM 16. When the data transferred to the SAM 16 is read out therefrom in response to the read clock signal CKR$_1$ synchronized with the clock signal CKW, the input data and the output data are delayed by a delay time of substantially one frame period. Then, the output data is supplied through the multiplier 5 to the adder 3 thereby to form a kind of cyclic-type filter, to achieve the noise reducer function.

When the data is written in the SAM 11 on the basis of the clock signal CKW containing a jitter component and the data is read out from the SAM 18 on the basis of the fixed reference clock signal CKR$_2$ containing no jitter component, the function of a time base corrector can be achieved.

Figure 7:
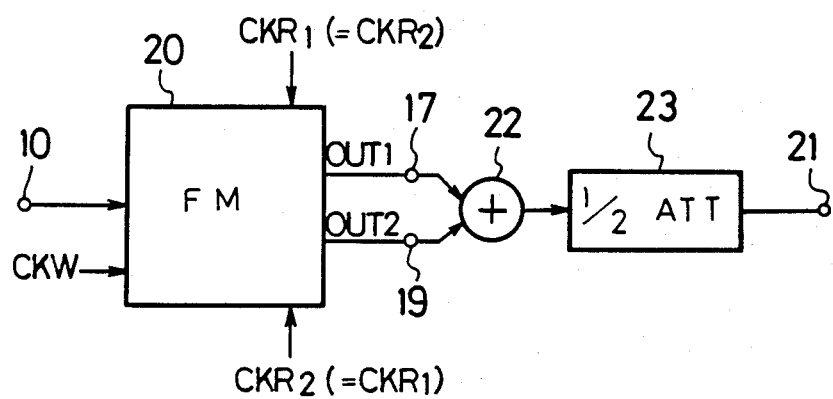
FIG. 7 is a block diagram schematically showing another embodiment of the video memory apparatus according to the present invention.

FIG. 7 schematically illustrates another embodiment of the video memory apparatus according to the present invention which employs the frame memory shown in FIG. 5. According to this embodiment, the same frame memory is used to achieve the function of the time base corrector and the function of a comb filter.

Referring to FIG. 7, the output terminals 17 and 19 of the frame memory 20 are connected to respective input terminals of an adder 22, and a ½ attenuator 23 is connected to receive the output of the adder 22. Then, the write clock signal CKW applied to the SAM 11 and the read clock signals CKR$_1$ and CKR$_2$ applied to the SAMs 16 and 18 of the frame memory 20 (FIG. 5) are made asynchronous to one another and the read clock signals CKR$_1$ and CKR$_2$ are synchronized with each other, and are used as reference signals developed externally. Since the write clock signal CKW is made asynchronous to the read clock signals CKR$_1$ and CKR$_2$, also in this case, it is necessary to prevent transfer pulses of the respective ports from being overlapped simultaneously during a period of one horizontal line (1H).

According to this embodiment, data is written in the SAM 11 in response to the clock signal CKW containing the jitter component and data are read out from the SAMs 16 and 18 in response to the fixed reference clock signals CKR$_1$ and CKR$_2$ containing no jitter component, whereby the function of the time base corrector can be achieved.

The video signal consists of a luminance signal Y and a chrominance signal C and the chrominance signal C is inverted at every line so that if the video signal of the present line is taken as Y+C, a video signal of a next line is expressed as Y−C. Accordingly, when both of the video signals Y+C and Y−C are added and then the sum is divided by 2, $$\frac{(Y + C) + (Y - C)}{2} = Y$$

can be established. Thus, the luminance signal Y can be separated from the video signal. Therefore, according to this embodiment, when the respective output signals from the SAMs 16 and 18 are added by the adder 22 and the added output therefrom is divided by 2 by the ½ attenuator 23, the separated luminance signal can be obtained at the output terminal 21. That is, the same function as that of the comb filter can be achieved.

As set forth above, according to the video memory apparatus of the present invention, the input buffer means is connected to the input side of the memory means, the first and second output buffer means are connected to the output side of the memory means and the input buffer means is made asynchronous to at least either the first or second output buffer means. Thus, the function of the time base corrector, the function of the noise reducer and the function of the comb filter can be achieved by the single memory without making the peripheral control circuit complicated, the quality of picture can be improved and the circuit arrangement can be simplified.

Figure 3:
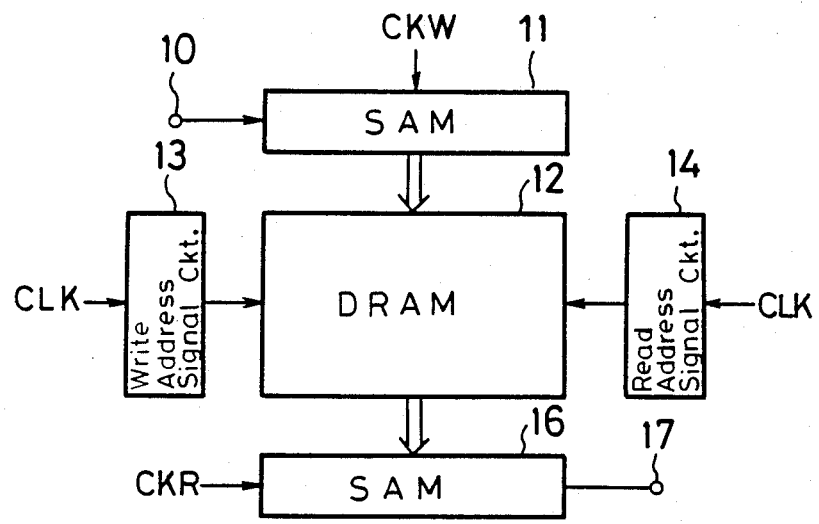
FIG. 3 is a block diagram showing a known arrangement of a frame memory.
Figure 4:
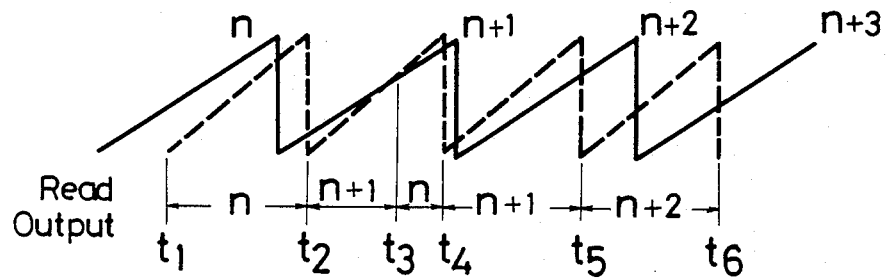
FIG. 4 is a diagram used to explain the occurrence of the crossing between write and read address signals.

An embodiment of the frequency converting circuit according to the present invention will be described with reference to FIG. 8 which is a block diagram showing a circuit arrangement of this embodiment. In this embodiment, the frame memory shown in FIG. 3 is employed so that in FIG. 8, like parts corresponding to those of FIG. 3 are marked with the same references and will not be described in detail.

Figure 8:
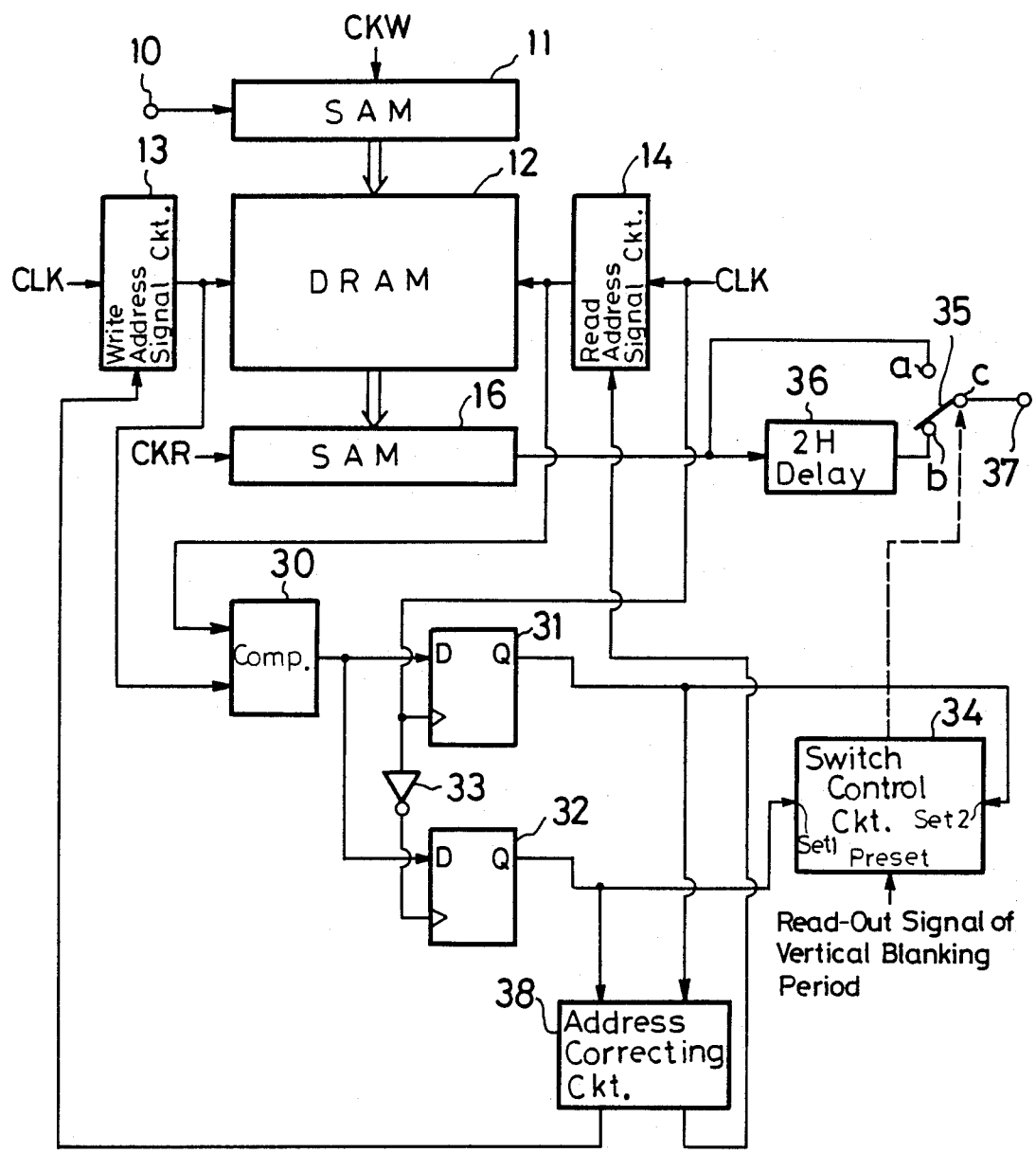
FIG. 8 is a block diagram schematically showing an embodiment of a frequency converting circuit according to the present invention.

Referring to FIG. 8, there is shown a comparator 30 which compares the address signal from the write address circuit 13 and the address signal from the read address signal circuit 14. The comparator 30 generates a flag signal when one address signal crosses the other. The flag signal from the comparator 30 is supplied to the input terminals D of a pair of flip-flop circuits 31 and 32. The clock signal CLK applied to the read address circuit 14 is supplied to the clock terminal of the flip-flop circuit 31 and also supplied through an inverter 33 to the clock terminal of the flip-flop circuit 32. When the state in which the writing is ahead of the reading is changed to the state in which the reading is ahead of the writing, or when the read address signal crosses the write address signal, the output of the flip-flop circuit 32 becomes "1" (high level) and the output of the flip-flop circuit 31 becomes "0" (low level). Further, when the state in which the reading is ahead of the writing is changed to the state in which the writing is ahead of the reading, or when the write address signal crosses the read address signal, the output of the flip-flop circuit 31 becomes "1" and the output of the flip-flop circuit 32 becomes "0".

The output of the flip-flop circuit 31 is supplied to a set terminal SET2 of a switching control circuit 34, while the output of the flip-flop circuit 32 is supplied to a set terminal SET1 of the switching control circuit 34. The switching control circuit 34 controls a switch 35 so as to connect its movable contact c to one fixed contact a during a vertical blanking period of the reading. When the control circuit 34 is supplied at either its set terminal SET1 or SET2 with the signal "1", the switching control circuit 34 controls the switch 35 so as to connect its movable contact c to the fixed contact a after a predetermined period of time, for example, 2H following the signal "1" being supplied thereto. The other fixed contact b of the switch 35 is connected through a 2H delay circuit 36 to the output side of the SAM 16 and the fixed contact a of the switch 35 is directly connected to the output side of the SAM 16. The common terminal c of the switch 35 is connected to an output terminal 37.

The output signals from the flip-flop circuits 31 and 32 are supplied to an address correcting circuit 38, responsive to the output signals from the flip-flop circuits 31 and 32, the address correcting circuit 38 controls the write address circuit 13 or the read address circuit 14. Specifically, when the flip-flop circuit 32 generates an output "1" and the flip-flop circuit 31 generates an output "0", the address correcting circuit 38 controls the read address circuit 14 so as to make the sequential order of its address signal as −2, while when the flip-flop circuit 31 generates the output "1" and the flip-flop circuit 32 generates the output "0", the address correcting circuit 38 controls the write address circuit 13 so as to make the sequential order of its address signal by +2. In other words, the state of the applicable address circuit is increased or decreased by 2.

The operation of the frequency converting circuit shown in FIG. 8 will be described with reference to FIGS. 9 to 12.

Figure 9A:
FIGS. 9A to 9F are respectively diagrams used to explain the generation of flags in the embodiment shown in FIG. 8.
Figure 9B:
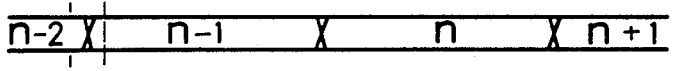
Figure 9C:
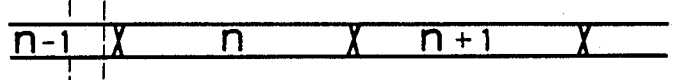
Figure 9D:

FIGS. 9A to 9F are respectively diagrams used to explain flag signals generated at the output side of the comparator 30. A clock signal CLK shown in FIG. 9A is supplied to the read address circuit 14 and to the clock terminal of the flip-flop circuit 31. This clock signal CLK is further supplied through the inverter 33 to the clock terminal of the flip-flop circuit 32. When the state of the read address signal, shown in FIG. 9B, from the read address circuit 14 is higher than that of the write address signal, shown in FIG. 9C, from the write address circuit 13, as will be clear from FIGS. 9B and 9C, the read address signal crosses the write address signal. When the read address signal coincides with the write address signal in part, or the read address signal crosses the write address signal, the comparator 30 generates a flag signal shown in FIG. 9D. For example, when (n−1)-th, n-th and (n+1)-th read and write address signals coincide with one another in part, the comparator 30 generates flag signals as shown in FIGS. 9B to 9D.

Figure 9E:
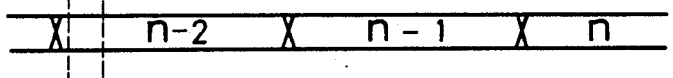
Figure 9F:

If the state of the write address signal is higher than that of the read address signal, as will be clear from FIGS. 9B and 9E, the write address signal crosses the read address signal. When the write address signal coincides with the read address signal in part, or the write address signal crosses the read address signal, the comparator 30 generates a flag signal shown in FIG. 9F. For example, the comparator 30 generates the flag signals when the (n−2)-th, (n−1)-th and n-th read and write address signals coincide with one another in part as shown in FIGS. 9B, 9E and 9F.

The flag signal generated at the output side of the comparator 30 is supplied to the D input terminals of the flip-flop circuits 31 and 32, so that when the clock signal CLK applied to the read address circuit 14 is supplied to the clock terminals of the flip-flop circuits 31 and 32, the flag signal is manifested by the flip-flop circuits 31 and 32 at their output terminals Q. In other words, when the read address signal (FIG. 9B) crosses the write address signal (FIG. 9C), the flag signal shown in FIG. 9D is generated, and the flip-flop circuit 32, at the time of the trailing edge of the clock signal CLK shown in FIG. 9A, generates the output "1" (while the flip-flop circuit 31 generates the output "0"); and when the write address signal (FIG. 9E) crosses the read address signal (FIG. 9B), the flag signal shown in FIG. 9F is generated, and the flip-flop circuit 31, at the time of the leading edge of the clock signal CLK shown in FIG. 9A generates the output "1" (while the flip-flop circuit 32 generates the output "0").

Figures 10A, 10B, 10C, 11A, 11B, 11C:
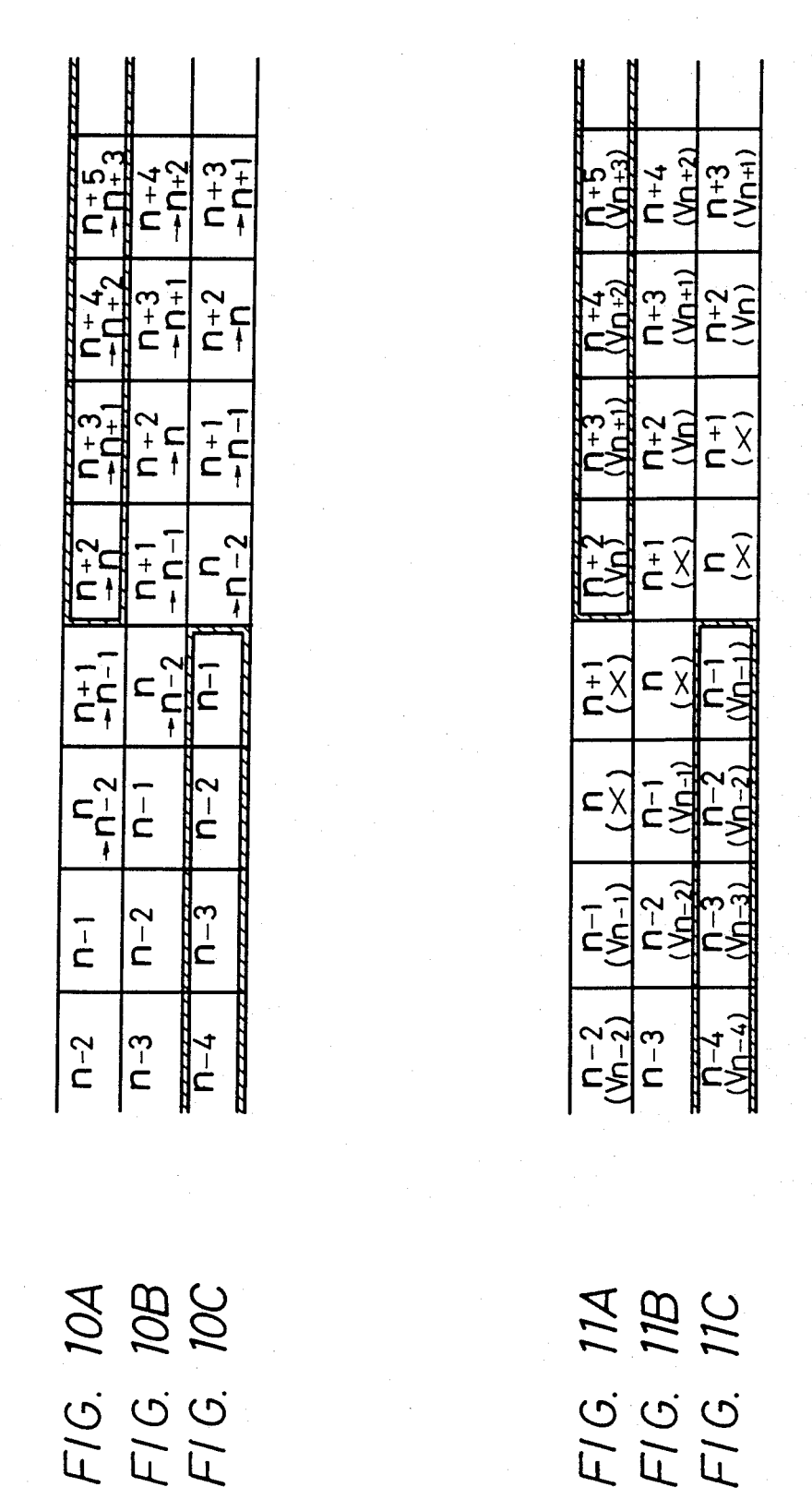

Upon normal operation, in which the read and write address signals do not cross with each other, the switch control circuit 34 allows the movable contact c of the switch 35 to be connected to its fixed contact b, so that the frame memory, or the SAM 16 generates the video signals corresponding to the (n−2)-th, (n−1)-th, n-th, (n+1)-th, . . . , (n+5)-th address signals, in turn as shown in FIG. 10A. As the result, at the output terminal 37, connected to the movable contact c, are generated in turn the video signals corresponding to the (n−4)-th, (n−3)-th (n−2)-th, (n−1)-th, n-th, . . . , (n+3)-th address signals, which all result from delaying the outputs of the SAM 16 by the 2H in the 2H delay circuit 36 as shown in FIG. 10C.

However, when the read address signal crosses the write address signal as described above, the flip-flop circuit 32 generates the output "1" and the flip-flop circuit 31 generates the output "0", with the result that the address correcting circuit 38 controls the read address circuit 14 so as to shift the timing at which the crossing occurs, for example, n-th address by −2 as shown in FIG. 10A. Thus, the (n−2)-th address signal is generated from the read address circuit 14 and supplied to the DRAM 12. In like manner, the read address circuit 14 sequentially generates the address signals in the shifted form, such as (n−1)-th address signal for (n+1)-th address signal, (n+3)-th address signal for (n+1)-th address signal, . . . , by −2 each. Then, after 2H periods from the time when the crossing occurs, the output of the flip-flop circuit 32 becomes "1" and the output of the flip-flop circuit 31 becomes "0", and the switching control circuit 34 controls the switch 35 so as to allow its movable contact c to be connected to the contact a.

While the video signals corresponding to the (n−4)-th, (n−3)-th, (n−2)-th and (n−1)-th address signals shown in FIG. 10C are generated at the output terminal 37, after the switch 35 connects its movable contact c to the fixed contact a, video signals corresponding to those at n-th, (n+1)-th, (n+2)-th and (n+3)-th shown in the right-hand and lower side of FIG. 10A are generated at the output terminal 37. In other words, the video signals are generated at the output terminal 37 in the order encircled by the hatched areas in FIG. 10A.

Figure 12:
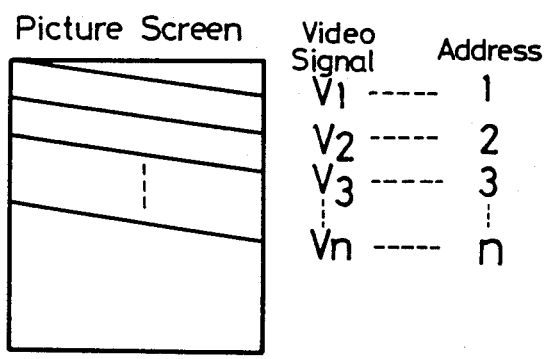
FIG. 12 is a diagram showing a relationship between a video signal and the position of an address signal.

When the write address signal crosses the read address signal, the output of the flip-flop circuit 31 becomes "1" and the output of the flip-flop circuit 32 becomes "0", so that the address correcting circuit 38 controls the write address circuit 13 so as to shift an address signal at a crossing time point, for example, an n-th address signal by +2 as shown in FIG. 11A and to supply and (n+2)-th address signal to the DRAM 12. Then, a video signal corresponding to the n-th address signal is written in the DRAM 12 at its predetermined position corresponding to the (n+2)-th address signal. In other words, in the normal mode where no crossing occurs, video signals $V_1, V_2, V_3, \ldots, V_n$ are written in and read out in turn in response to the respective addresses $1, 2, 3, \ldots n$ as shown in FIG. 12. When the write address signal crosses the read address signal, the video signal is not written at the positions of the crossing address signal and the next address signal, but is sequentially written from the position corresponding to the address signal shifted by +2. Accordingly, as shown in FIG. 11A, no video signal is written in the positions corresponding to the n-th address signal of a crossing time point and the next (n+1)-th address signal, but a video signal $V_n$ corresponding to the n-th address signal is written in the position corresponding to the (n+2)-th address signal; and a video signal $V_n$ corresponding to the (n+1)-th address signal is written in the position corresponding to the (n+3)-th address signal. This is also true for the succeeding video signals.

After 24 periods from a time point where the crossing occurs, or when the output of the flip-flop circuit 31 becomes "1" and the output of the flip-flop circuit 32 becomes "0", the switch control circuit 34 supplies the control signal to the switch 35, so that the switch 35 connects its movable contact c to the fixed contact a. Then, while video signals $V_{n-4}, V_{n-3}, V_{n-2}$ and $V_{n-1}$ corresponding to the (n−4)-th, (n−3)-th, (n−2)-th and (n−1)-th address signals (FIG. 11C) were previously sequentially delivered through the 2H delay circuit 36 to the output terminal 37, after the movable contact c of the switch 35 is connected to the fixed contact a, video signals $V_n, V_{n+1}, V_{n+2}, V_{n+3}$ corresponding to the (n+2)-th, (n+3)-th, (n+4)-th and (n+5)-th address signals as shown in FIG. 10A are delivered to the output terminal 37. That is, the video signal corresponding to the respective address signals in the sequential order encircled by the hatched areas in FIG. 11 are sequentially developed at the output terminal 37.

According to the frequency converting circuit of the present invention, as set forth above, when it is found that the crossing occurs between the first and second address signals as the result of the comparison of them, the sequential order in which the address signal is supplied to the memory is switched and the continuous output signal is derived from the memory, so that the occurrence of the crossing between the address signals can be avoided. Accordingly, when input data is processed in the data form of upper and lower bits, no trouble occurs and it becomes possible to prevent a serious bad influence from being exerted upon the picture which was a disadvantage of the prior art.

Furthermore, according to the present invention, the crossing itself between the address signals can be avoided, so that unlike the prior art, the crossing detection circuit, the chroma inverter or the like can be removed, with the circuit arrangement being simplified accordingly.

The above description is given on the preferred embodiments of the invention, but it will be apparent that many modifications and variations could be effected by one skilled in the art without departing from the spirit or scope of the novel concepts of the invention, so that the scope of the invention should be determined by the appended claims only.

We claim as our invention:

1. A video memory apparatus comprising:
  (a) input buffer means supplied with an input video signal;
  (b) memory means connected to receive and store an output of said input buffer means; and
  (c) first and second output buffer means connected to said memory means for alternately receiving outputs of said memory means, wherein said input buffer means and at least either said first or second output buffer means are operated in an asynchronous relation to each other.

2. Apparatus according to claim 1, including first and second address means for manifesting addresses of said memory means and for causing said memory means to read out data from said addresses to said first and second output buffers, respectively.

3. Apparatus according to claim 2, including third address means for manifesting addresses at which data from said input buffer means is stored.

4. Apparatus according to claim 1, wherein said first and second output buffers are clocked memory units, each being connected to an independent source of clock pulses.

5. Apparatus according to claim 1, wherein said input buffer means comprises a memory for accepting serial input data and for transferring a plurality of bits of said input data in parallel to said memory means, and said first and second output buffer means each comprises a memory for accepting a plurality of data bits from said memory in parallel, and for providing data in series to first and second outputs, respectively.

6. Video memory apparatus comprising a frame memory, an adder unit having a video signal connected to one input and having its output connected to an input of said frame memory, first and second output terminals connected to receive separate outputs of said frame memory, and means for connecting only one of said two outputs through a multiplier unit to an input of said adder unit.

7. Video memory apparatus comprising a frame memory for storing frames of video data, said frame memory having first and second outputs for manifesting data stored in said memory corresponding to successive lines consisting of luminance and chrominance components of Y+C and Y−C, respectively, and adder means connected to said first and second outputs for adding data corresponding to said successive lines for producing an output signal corresponding to the luminance Y component of said video signal.

8. Apparatus according to claim 6, including means for supplying said input video signal in synchronism with a clock signal, and means for synchronizing said one output of said frame memory with said clock signal.

9. Apparatus according to claim 8, including means for synchronizing the other of said first and second outputs of said frame memory to be asynchronous with said clock signal.

10. Apparatus according to claim 6, including means for delaying the data read out from said frame memory by one frame period, relative to its time of arrival at said video input.

11. Apparatus according to claim 7, including means for supplying clock signals to clock the outputs from said first and second outputs, said outputs being synchronized with each other, and asynchronous with the input of data into said memory.

12. Apparatus according to claim 7, including means for supplying as input data to said frame memory successive portions of video data in which alternate portions represent y+c, and interposed portions represent y−c, and means for manifesting two successive portions, whereby the addition of said portions provide a signal proportional to the luminance component y.

13. Apparatus according to claim 12, including means connected to said adder means for dividing the output thereof by two, to provide a signal equal to said luminance component.

14. Apparatus according to claim 1, including an adder unit having a video signal connected to one input and having its output connected to said input buffer means, and a multiplier unit connected to one of said first and second output buffer means, and having its output connected to a second input of said adder unit.

15. Apparatus according to claim 1, including adder means connected to said first and second output buffer means for adding data corresponding to successive signals stored in said memory means, for producing an output signal corresponding to the luminance component of said video signal.

16. Video apparatus incorporating a single memory for performing the functions of time base corrector, noise reducer, and comb filter, comprising, in combination:
input buffer means supplied with an input video signal;
memory means connected to receive and store an output of said input buffer means,
first and second output buffer means connected to said memory means for alternately receiving outputs of said memory means, wherein said input buffer means and at least either said first or second output buffer means are operated in an asynchronous relation to each other;
an adder unit having a video signal connected to one of its inputs and having its output connected as a input to said memory means, and means for connecting only one of said first and second output buffer means through a multiplier unit to another input of said adder unit;
said memory means storing data representing successive video frames; and
an adder means connected to said first and second output buffer means for adding data corresponding to said successive frames for producing an output signal corresponding to the luminance component of said video signal.

* * * * *